(12) United States Patent
Fuergut et al.

(10) Patent No.: US 8,580,070 B2
(45) Date of Patent: Nov. 12, 2013

(54) METHOD OF APPLYING AN ADHESIVE LAYER ON THINCUT SEMICONDUCTOR CHIPS OF A SEMICONDUCTOR WAFER

(76) Inventors: Edward Fuergut, Dasing (DE); Hermann Vilsmeier, Höhenkirchen (DE); Simon Jerebic, Regensburg (DE); Michael Bauer, Nittendorf (DE)

( * ) Notice: Subject to any disclaimer, the term of this patent is extended or adjusted under 35 U.S.C. 154(b) by 1253 days.

(21) Appl. No.: 11/720,954

(22) PCT Filed: Nov. 9, 2005

(86) PCT No.: PCT/DE2005/002016
§ 371 (c)(1),
(2), (4) Date: Jan. 12, 2011

(87) PCT Pub. No.: WO2006/060976
PCT Pub. Date: Jun. 15, 2006

(65) Prior Publication Data
US 2011/0155297 A1    Jun. 30, 2011

(30) Foreign Application Priority Data
Dec. 6, 2004 (DE) .......................... 10 2004 058 876

(51) Int. Cl.
*B32B 37/02*  (2006.01)
(52) U.S. Cl.
USPC ..................................... 156/273.9
(58) Field of Classification Search
USPC .......... 156/83, 272.2, 272.8, 273.9, 247, 154, 156/153
See application file for complete search history.

(56) References Cited

U.S. PATENT DOCUMENTS

| | | | |
|---|---|---|---|
| 4,722,130 A * | 2/1988 | Kimura et al. | 29/413 |
| 4,793,883 A | 12/1988 | Sheyon et al. | |
| 6,140,151 A | 10/2000 | Akram | |
| 6,159,323 A | 12/2000 | Joly et al. | |
| 6,425,971 B1 * | 7/2002 | Silverbrook | 156/230 |
| 6,638,865 B2 | 10/2003 | Tanaka | |
| 6,727,162 B2 | 4/2004 | Holzapfel et al. | |
| 6,972,069 B2 | 12/2005 | Hecht et al. | |

FOREIGN PATENT DOCUMENTS

| | | |
|---|---|---|
| DE | 10048881 | 3/2002 |
| DE | 10159974 | 10/2003 |
| EP | 1195809 | 10/2002 |
| JP | 05078629 | 3/1993 |
| JP | 2001156028 | 11/1999 |
| JP | 2004311848 | 11/2004 |

* cited by examiner

*Primary Examiner* — Daniel McNally
(74) *Attorney, Agent, or Firm* — Dicke, Billig & Czaja, PLLC

(57) ABSTRACT

The invention relates to a method for making a semiconductor. In one embodiment the method includes applying an adhesive layer to ground-thin or thinned semiconductor chips of a semiconductor wafer. In this embodiment, the adhesive layer composed of curable adhesive is introduced relatively early into a method for the thinning by grinding, separation and singulation of a semiconductor wafer to form thinned semiconductor chips, and is used further in a semiconductor device into which the thinned semiconductor chip is to be incorporated.

19 Claims, 5 Drawing Sheets

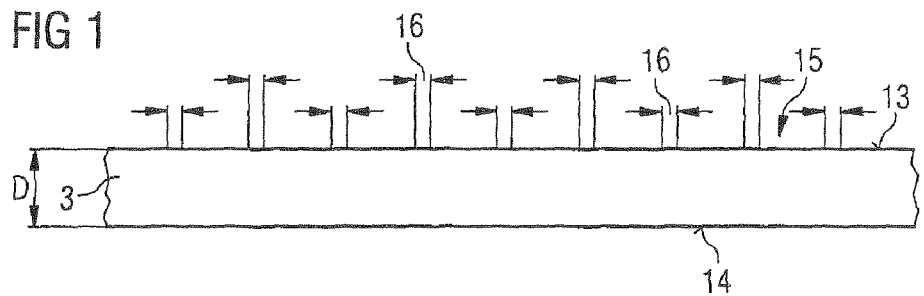
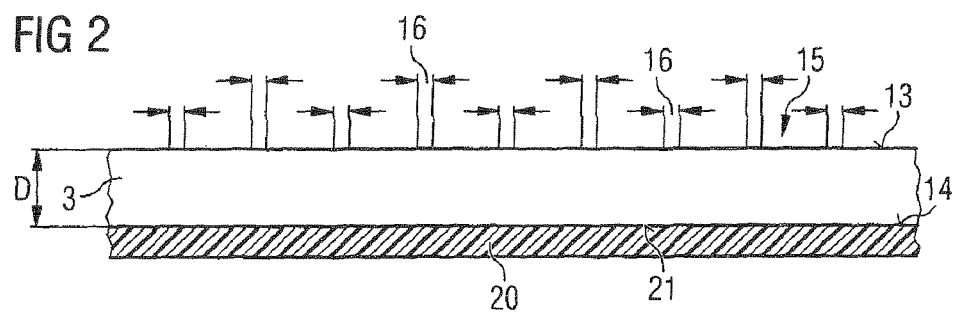
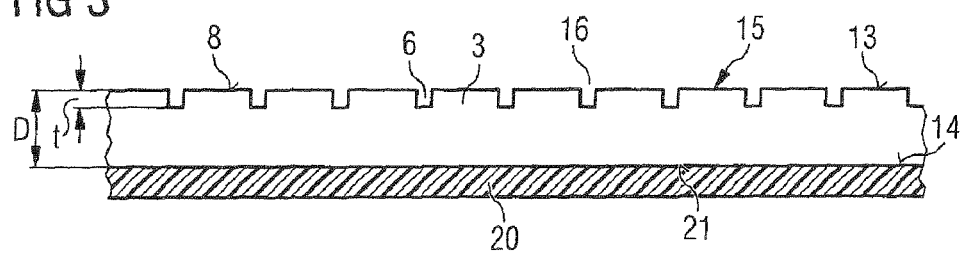

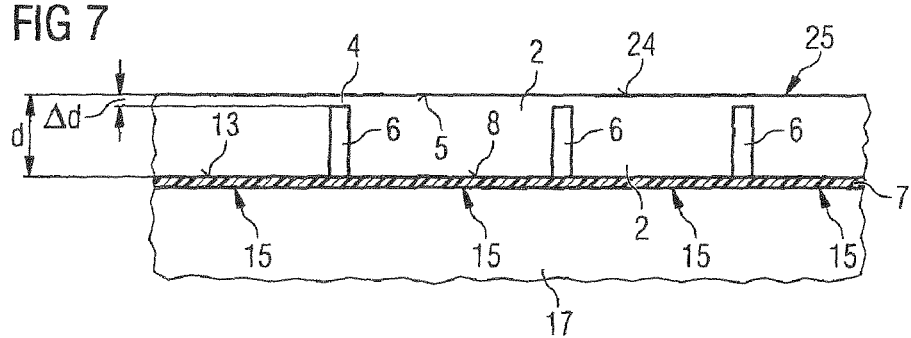
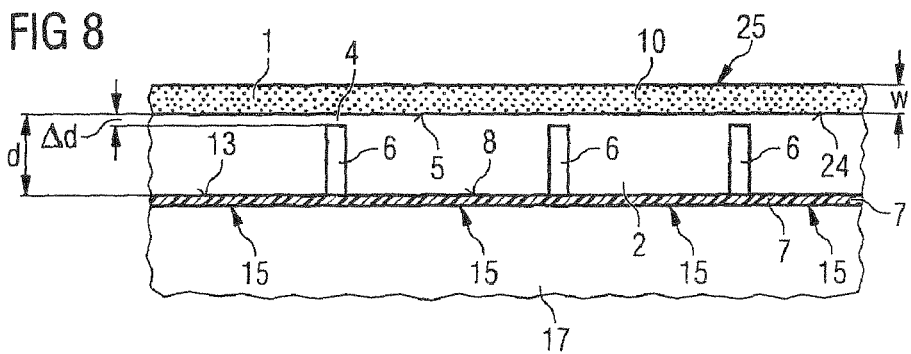
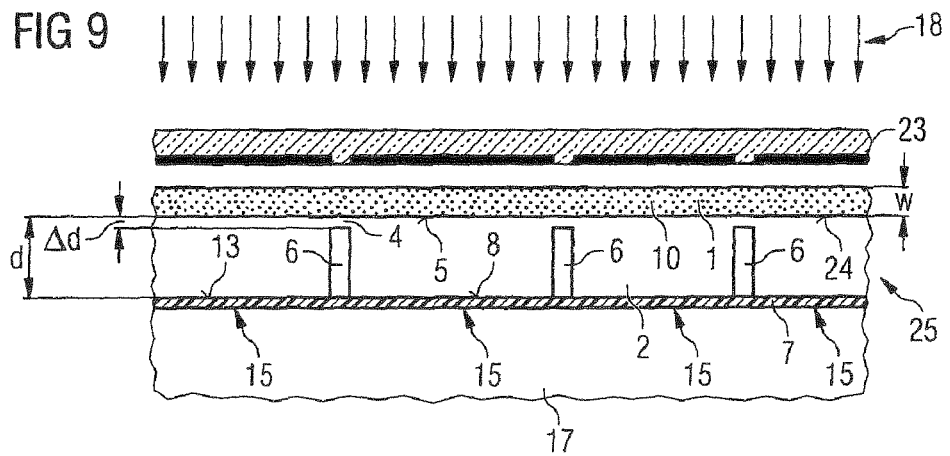

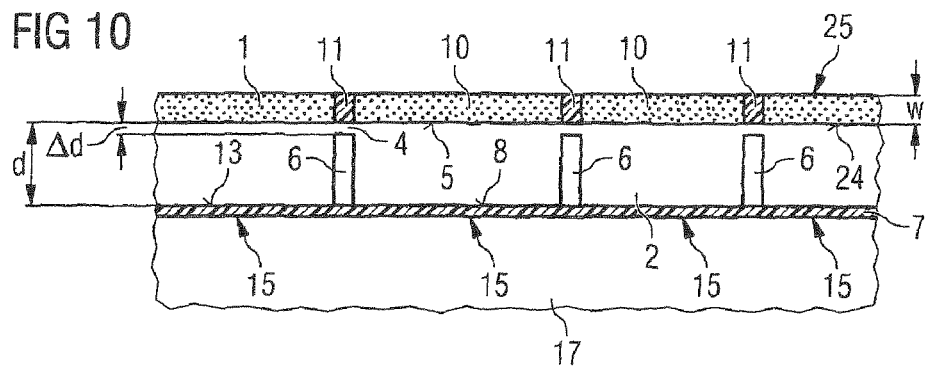
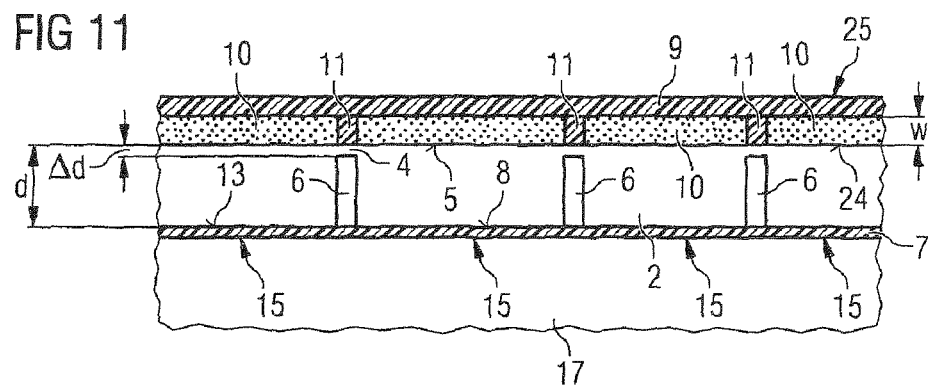
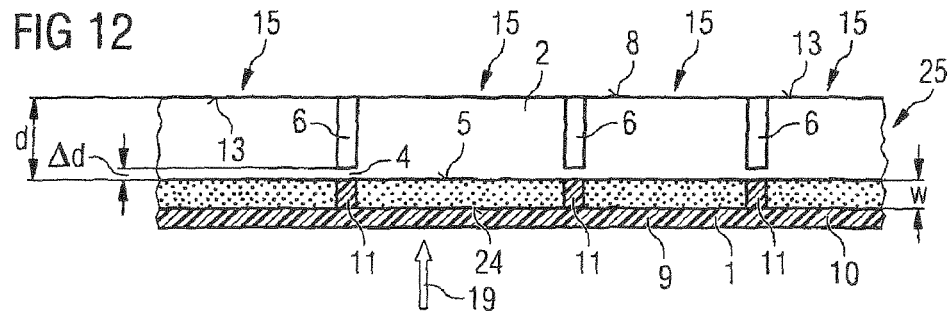

METHOD OF APPLYING AN ADHESIVE LAYER ON THINCUT SEMICONDUCTOR CHIPS OF A SEMICONDUCTOR WAFER

CROSS REFERENCE TO RELATED APPLICATION

This Utility Patent Application claims the benefit of the filing date of German Application No. DE10 2004 058 876.7, filed Dec. 6, 2004, and International Application No. PCT/DE2005/002016, filed Nov. 9, 2005, both of which are herein incorporated by reference.

The invention relates to a method for applying an adhesive layer to ground-thin semiconductor chips of a semiconductor wafer.

The document DE 100 48 881 discloses a method for the thinning by grinding of product wafers. In this method, the entire product wafer is thinned by grinding from its rear side and the ground-thin product wafer, which is connected to a carrier wafer, is subsequently sawn into individual semiconductor chips. In this known method there is a problem in removing the thinned semiconductor chips from a carrier wafer without destroying them, and in preparing them for further processing to form a semiconductor device. With increasing miniaturization of the semiconductor chips, in particular with increasing reduction of the volume of the semiconductor chip by decreasing its thickness d by means of thinning by etching or thinning by grinding to a thickness of just a few tens of μm, it becomes increasingly difficult to handle semiconductor chips in a semiconductor chip mounting installation or, after the thinning by grinding process, in a corresponding lapping and polishing device.

At the present time the failure rate when using standard handling tools in a semiconductor chip mounting installation is already about 20%. Given such a high proportion of damaged thinned semiconductor chips, particularly in the case of semiconductor chips intended for radiofrequency application, it is necessary to reduce this failure rate. Particularly serious failure rates occur in the installation regions for so-called "die bonding" or "die attach". In this case, the semiconductor chips are lifted off from a single-sided adhesive carrier film and brought to a position in which the thinned semiconductor chip is fixed onto a chip island of a system carrier in a device position for producing an electronic device.

For the lift-off of the semiconductor chips from a carrier film with an adhesive layer and the transfer to a vacuum pipette, the document DE 101 59 974 discloses a suitable mounting installation. In this case, the thinned semiconductor chip is picked up by the suction nipple of the vacuum pipette and brought to a corresponding position for the purpose of soldering or adhesive bonding, in which position is situated a chip island of a leadframe for receiving the semiconductor chip or a wiring substrate with a correspondingly provided contact pad for receiving the ground-thin semiconductor chip. The detachment of the rear side of the semiconductor chip from the adhesive of the carrier film is extremely problematic in this case since it is necessary to apply high forces that make it possible to overcome the adhesion between semiconductor chip and adhesive of the carrier film. This is particularly problematic for ground-thin semiconductor chips and entails the risk of fracture of the ground-thin semiconductor chips.

A further disadvantage is that after this detachment operation, a semiconductor chip is available which still has no fixing aids whatsoever for further processing and hence for fixing on a semiconductor chip island of a leadframe or for fixing on a contact pad or on a so-called "die bond pad". Such fixing aids are adhesive coatings or solder coatings on the rear side of the semiconductor chip by means of which the semiconductor chip can be fixed on the provided positions of the chip islands or the contact pads with simultaneous electrical contact-connection. The application of such auxiliary substances to a ground-thin semiconductor chip turns out to be correspondingly difficult and leads to an increased reject rate during the further processing of the ground-thin semiconductor chips.

BRIEF DESCRIPTION OF THE DRAWINGS

FIG. 1 shows a schematic cross section through a semiconductor wafer.

FIG. 2 shows a schematic cross section through the semiconductor wafer in accordance with FIG. 1 after the application of the semiconductor wafer to a wafer holder.

FIG. 3 shows a schematic cross section through the semiconductor wafer in accordance with FIG. 2 after the introduction of separating grooves.

FIG. 7 shows a schematic cross section through the thinned semiconductor wafer in accordance with FIG. 6 in greater detail.

FIG. 8 shows a schematic cross section through the thinned semiconductor wafer in accordance with FIG. 7 after the application of an adhesive layer to the interlinked rear side of the thinned semiconductor wafer.

FIG. 9 shows a schematic cross section through the thinned semiconductor wafer in accordance with FIG. 8 during the irradiation of the applied adhesive layer 1 through a UV exposure mask.

FIG. 10 shows a schematic cross section through the thinned semiconductor wafer in accordance with FIG. 9 after the removal of the exposure mask.

FIG. 11 shows a schematic cross section through the thinned semiconductor wafer in accordance with FIG. 10 after the application of a supporting and transporting film to the partly cured adhesive layer.

FIG. 12 shows a schematic cross section of the thinned semiconductor wafer in accordance with FIG. 11 after the removal of the supporting plate and also the protective film and during the attachment of a stylus for lifting off one of the thinned semiconductor chips from the supporting and transporting film.

DETAILED DESCRIPTION

Figure 4:
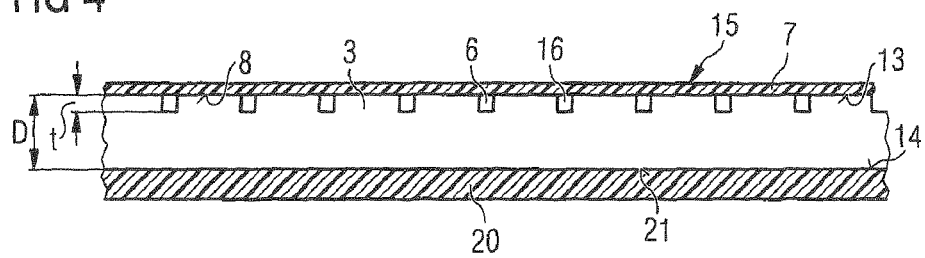
FIG. 4 shows a schematic cross section through the semiconductor wafer in accordance with FIG. 3 after the application of a protective film to the active top side of the semiconductor wafer provided with separating grooves.

One of more embodiments provide a method of making a semiconductor including a method for applying an adhesive layer to ground-thin semiconductor chips of a semiconductor wafer in which the semiconductor chip does not have to be individually provided with such an adhesive layer, rather a multiplicity of semiconductor chips can be provided with a corresponding adhesive layer without the risk of fracture of the semiconductor chips.

The invention provides a method for applying an adhesive layer to ground-thin semiconductor chips of a semiconductor wafer, wherein the method has the following method steps. The first step involves applying an adhesive layer having an adhesive that can be cured by means of irradiation to a ground-thin rear side—linked together by means of connecting webs—of a semiconductor wafer. The semiconductor wafer has separating grooves cutting through it on its active top side, which separating grooves delimit semiconductor chip positions and are covered by a protective film (7) on the top side of the semiconductor wafer.

The semiconductor wafer is thus held together by the connecting webs composed of semiconductor material on its rear side and by the protective film on its top side. Said adhesive layer, which completely covers the rear side of the semiconductor wafer, has the advantage that, in contrast to adhesive layers such as are known in the prior art for the detachment of semiconductor chips from a carrier coated with the adhesive layer, it remains with high adhesion on the rear sides of the semiconductor chips. After the application of the adhesive layer, the latter is selectively irradiated. In the process, cured adhesive forms in the regions of the connecting webs, while the adhesive in the regions of the semiconductor chips is not irradiated and, consequently, is not cured and therefore still adheres to the rear side of the semiconductor chips in the semiconductor chip positions. A supporting and transporting film is then applied to the adhesive layer.

The adhesion of the non-cured adhesive of the adhesive layer to the rear sides of the semiconductor chips is greater than the adhesion of the non-cured adhesive to the top side of the applied supporting and transporting film. This adhesion to the supporting and transporting film is so low that during later singulation of the ground-thin semiconductor chips, the adhesive layer with non-cured adhesive can be released from the supporting and transporting film without measurable loading of the ground-thin semiconductor chip. The adhesion of the adhesive layer to the supporting and transporting film is just enough to hold the partly separated semiconductor wafer during transport on the supporting and transporting film.

The protective film is finally removed from the top sides of the semiconductor chips after transport. Afterward, the thinned semiconductor chip together with the adhering non-cured adhesive layer is lifted off from the supporting and transporting film with breaking up of the connecting webs composed of semiconductor wafer material along the separating grooves. The connecting webs, which ensure that a linked-together rear side of the thinned semiconductor wafer can be coated with adhesive, provide desired breaking points at which the semiconductor chips can be broken off from one another during the lift-off operation or during the singulation of the semiconductor chips.

In this case, the lower adhesion of the non-cured adhesive to the supporting and transporting film has an advantageous effect during the lift-off of the thinned semiconductor chips. While the cured region of the adhesive layer in the region of the connecting webs remains on the supporting and transporting film, the semiconductor chip with the non-cured adhesive of the adhesive layer can be lifted off from the supporting and transporting film without appreciable expenditure of force. This exploits the fact that the adhesive layer remains on the rear side of the semiconductor chip by virtue of the higher adhesion of the non-cured adhesive to the material of the semiconductor chip in comparison with the adhesion to the supporting and transporting film.

One advantage of this method is that, on the one hand, the semiconductor chips do not have to be individually provided with an adhesive layer on the rear side after singulation, and it is advantageous, on the other hand, that all the processes for applying the adhesive layer are effected simultaneously for a multiplicity of semiconductor chips on the entire wafer separated into semiconductor chips. The risk of fracture of individual semiconductor chips is minimized in the case of this joint further processing. The adhesion differences are coordinated with one another by material differences and surface preparations. It is furthermore advantageous that a curable adhesive of low viscosity can be used in this method since the rear side of the ground-thin semiconductor wafer is still present in interlinked fashion and no adhesive can penetrate into the prefabricated separating grooves.

It is furthermore advantageous that the supporting and transporting film may comprise for example a highly polished metal film, while the rear sides of the semiconductor chips of a semiconductor wafer, on account of the preceding grinding processes, can be provided with a residual roughness that supports the adhesion differences with a non-cured adhesive layer. Furthermore, it is possible for the supporting and transporting film provided to be plastic films which have olefin or paraffin chain molecules and possess a smooth surface, such that an intensive adhesive bonding with the adhesive layer is impeded and it is possible to realize a significant adhesion difference with regard to the rear sides of the semiconductor chips and the top side of the supporting and transporting film.

Selective irradiation of the adhesive layer on the interlinked rear side of the ground-thin or thinned semiconductor wafer can preferably be effected by UV exposure through an exposure mask arranged at the semiconductor wafer prior to exposure. A UV-curable adhesive is used as the adhesive for this purpose.

Furthermore, selective irradiation of the adhesive layer on the interlinked rear side of the ground-thin or thinned semiconductor wafer can be effected by laser beam writing by means of a laser writing beam that is guided along the connecting webs and cures the plastic layer. For this purpose, an adhesive is used whose crosslinking activity is triggered and amplified by the frequency spectrum of the laser beam until the adhesive has cured.

Furthermore, selective irradiation of the adhesive layer on the interlinked rear side of the ground-thin or thinned semiconductor wafer can be effected by IR irradiation or microwave irradiation laser beam writing, materials that attenuate or absorb IR radiation or microwaves are used for a corresponding masking in order to ensure a selectivity and to cure only the adhesive over the connecting webs.

Prior to application of the adhesive layer, the method has the following method steps. The first step involves producing a semiconductor wafer having an active top side and an opposite rear side, which wafer is also called product wafer in the art. A multiplicity of semiconductor chip positions are arranged in rows and columns on the active top side of such a product wafer, separating tracks being provided between the semiconductor chip positions. In a next step, separating grooves are introduced into the semiconductor wafer along the separating tracks.

In this case, the depth t of the separating grooves is smaller than the thickness D of the semiconductor wafer. Furthermore, the depth t of the separating grooves is less than the thickness d of the thinned semiconductor chips provided. Thus, the semiconductor wafer, which usually has a thickness of between 500 µm and 750 µm given a diameter of between 150 mm and 300 mm, still holds the semiconductor slice together completely despite separating grooves, especially as the separating grooves reach a depth t that is a few micrometers smaller than the sought thickness d of the thinned semiconductor chips. The thickness of such thinned semiconductor chips is 50 μm to 200 μm. Therefore, enough material still remains to ensure the cohesion of the semiconductor wafer prior to thinning.

During the introduction of the separating grooves, the active top sides of the semiconductor wafer are uncovered, while the rear side of the semiconductor wafer is applied for example on a vacuum holder of a separating apparatus such as an air-mounted diamond saw or a laser beam removal apparatus for semiconductor wafers. In order to protect the sensitive active top sides of the semiconductor chips after the introduction of the separating grooves, an adhesive protective film and a supporting plate are then applied to the top side with separating grooves. Said supporting plate may simultaneously constitute a tool of a grinding, lapping and/or polishing machine. Such tools are preferably metal disks which are adapted to the size of the semiconductor slices and which receive the semiconductor wafers with their top sides having separating grooves and press their now freely accessible rear sides onto a grinding, lapping or polishing disk.

The thinning by grinding of the semiconductor wafer is continued from the rear side until the provided thickness Δd of the connecting webs of a few micrometers has been reached, and ground-thin semiconductor chips of the semiconductor chip positions are present on the protective film which are held together only by means of the semiconductor wafer material of the connecting webs. The protective film on the top side of the semiconductor chips supports this cohesion. The abovementioned adhesive layer composed of a non-cured adhesive can then be applied to the freely accessible rear side of the ground-thin semiconductor wafer. In this case, the adhesive layer preferably comprises an adhesive that can be cured by means of UV irradiation.

This method of UV irradiation has the advantage that the adhesion to the supporting and transporting film is improved by the curing in such a way that, during the lift-off of the semiconductor chips, the cured regions remain on the supporting and transporting film and a sawing process of adhesive material is thus avoided.

In order to ensure the removal of the protective film, an adhesive whose adhesion to the rear sides of the semiconductor chips is higher than the adhesion of the protective film to the top sides of the semiconductor chips is provided as the adhesive layer. Otherwise there would be the risk of semiconductor chips sticking to the protective film upon the removal of the protective film and causing a high level of rejects.

On the other hand, it is also possible to provide a protective film having higher adhesion to the semiconductor chips and to remove the protective film by means of sputtering from the top side of the semiconductor chips. Such sputtering or ashing can be carried out with the aid of a plasma atmosphere. Furthermore, it is possible, if the adhesion of the protective film on the top side of the semiconductor chips is too high, to achieve the removal of the protective film from the top side by dissolution of the protective film in a solvent. Finally, the protective film can be effected from the top side by swelling of the protective film in a solvent with subsequent facilitated pulling off since the adhesion of the protective film to the top side of the semiconductor chips is reduced by the swelling.

For the further processing of the semiconductor wafer separated into semiconductor chips, the supporting and transporting film preferably has a mounting frame and can be mounted with the mounting frame after the irradiation and curing of the adhesive of the adhesive layer in the regions of the separating grooves at an automatic singulation and/or placement machine. This method variant has the advantage that the supporting film can inherently be made extremely thin since it is spanned and held level by a solid mounting frame.

In one preferred exemplary implementation of the method, it is provided that the lift-off of the thinned semiconductor chips with non-cured adhesive layer on their rear sides from the supporting and transporting film is effected by means of a stylus. Said stylus pierces the supporting and transporting film and raises the thinned semiconductor chip with adhesive layer to an extent such that it can be accepted by a vacuum pipette for further transport. This exemplary implementation of the method has the advantage over the method known from the document DE 101 59 974 that now a thinned semiconductor chip is available which has already been provided with an applied, non-cured adhesive layer. Consequently, in a further step of the method, the thinned semiconductor chip for further processing to form a semiconductor device with the non-cured adhesive layer on its rear side can be adhesively bonded onto a semiconductor chip position of a system carrier. Such a system carrier may be a wiring substrate of a BGA housing (Ball Grid Array Housing) or a chip island of a leadframe or a further chip.

To summarize, it can be established that with the invention, by means of an additional process step in the process chain from the thinning of a semiconductor wafer to the singulation of the ground-thin semiconductor chips, a thinned semiconductor chip with an adhering adhesive layer can be removed from a supporting and transporting film and be supplied directly for further processing. In this case, the adhesive is constituted such that it cures upon corresponding irradiation and enables a semiconductor chip with an applied adhesive layer to be available for further processing. The advantages of this method are listed in summary below.

1. The process is fully compatible with the process of thinning semiconductor wafers by grinding, which is also called "dicing before grinding" (DBG process).
2. There is no need for a complicated separation process that cuts into an adhesive film as in the case of laser cutting or in the case of additional sawing for the purpose of singulation.
3. The process can be effected over the whole area over the entire wafer produced according to the "DBG" process.
4. No disturbing transitions arise between adhesive and semiconductor chip since the irradiation produces a sharp edge between cured and non-cured adhesive.
5. There is the possibility of using cost-effective pasty adhesives for the adhesive layer, especially as after thinning an interlinked semiconductor wafer rear side is available for the application of the adhesive layer.

The sequence of a method in which a semiconductor wafer is separated into semiconductor chips and thinned by grinding is described with the aid of FIGS. 1 to 13 below, the application of an adhesive layer to the rear side of the thinned semiconductor chips of said semiconductor wafer being realized simultaneously in the context of this method.

FIG. 1 shows a schematic cross section through a semiconductor wafer 3 having a thickness D of 500 to 750 μm and having on its active top side 13 semiconductor chip positions 15 arranged in rows and columns, while separating tracks 16 are arranged between the semiconductor chip positions 15 in order to separate the semiconductor wafer 3 into individual semiconductor chips.

FIG. 2 shows a schematic cross section through the semiconductor wafer 3 in accordance with FIG. 1 after the application of the semiconductor wafer 3 to a wafer holder 20. The semiconductor wafer 3 is applied by its rear side 14 to the wafer holder 20 of a separating apparatus, the wafer holder 20 of the separating apparatus usually being a vacuum plate that holds the semiconductor wafer 3 and its rear side 14 on the top side 21 of the wafer holder 20, while separating grooves are introduced into the top side 13 of the semiconductor wafer 3 in the regions of the separating tracks 16.

FIG. 3 shows a schematic cross section through the semiconductor wafer 3 in accordance with FIG. 2 after the introduction of separating grooves 6 into the top side 13 of the semiconductor wafer 3. The separating grooves 6 are introduced into the top side 13 of the semiconductor wafer 3 as far as a depth t, the depth t being less than the thickness D of the semiconductor wafer 3 and a few micrometers less than the planned or provided thickness of thinned semiconductor chips.

FIG. 4 shows a schematic cross section of the semiconductor wafer 3 in accordance with FIG. 3 after the application of a protective film 7 to the active top side 13 of the semiconductor wafer 3 provided with separating grooves 6. Said protective film 7 has a thin adhesive layer by which the protective film 7 adheres on the active top side 13 of the semiconductor wafer 3. In this case, the protective film 7 does not penetrate into the separating grooves 6.

Figure 5:
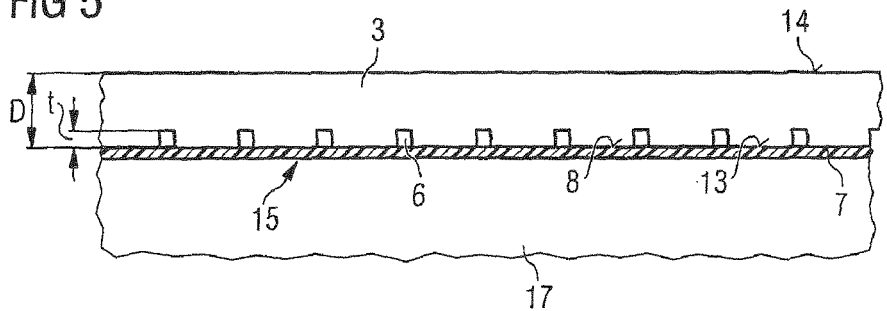
FIG. 5 shows a schematic cross section through the semiconductor wafer in accordance with FIG. 4 after the application of a supporting plate to the protective film.

FIG. 5 shows a schematic cross section through the semiconductor wafer 3 in accordance with FIG. 4 after the application of a supporting plate 17 to the protective film 7. Said supporting plate 17 is part of a tool of a grinding, lapping and/or polishing machine. By means of such grinding, lapping and/or polishing machines, the top sides to be ground, such as here the rear side 14 of the semiconductor wafer 3, are machined by the tool connected to the supporting plate 17 pressing said rear side 14 onto a grinding, lapping and/or polishing disk, the weight of the tool determining the contact pressure and the tool being rotationally symmetrical and causing rotation of the rear side 14 to be ground of the semiconductor wafer 3 on the grinding, lapping and/or polishing disk. In the case of lapping and polishing, the lapping and/or polishing disk is provided with a paste composed of oily liquids and abrasive micro particles in order to machine the rear side 14 of the wafer in thinning fashion.

Figure 6:
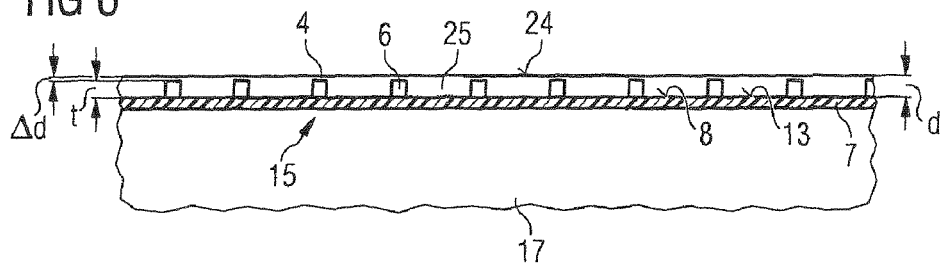
FIG. 6 shows a schematic cross section through thinned semiconductor chips on the protective film with supporting plate after thinning by grinding of the semiconductor wafer in accordance with FIG. 5.

FIG. 6 shows a schematic cross section through thinned semiconductor chips 2 on the protective film 7 with supporting plate 17 after the thinning by grinding of the semiconductor wafer 3 in accordance with FIG. 5. Since the depth t of the separating grooves 6 is less than the provided thickness d of the thinned semiconductor chips 2, the entire volume of the semiconductor wafer 3, as is shown in FIG. 5, is removed from the rear side 14 shown in FIG. 5 until only a semiconductor material a few micrometers thick of connecting webs 4 with a thickness $\Delta d = d - t$ holds the semiconductor chips 2 together. While the active top sides 8 of the thinned semiconductor chips 2 are protected by the protective film 7, the rear side 24 of the semiconductor wafer 3 is now freely accessible. An adhesive layer is applied to this rear side 24 of the thinned semiconductor wafer 25 by means of the method step shown in FIG. 8.

FIG. 7 shows a schematic cross section through the thinned semiconductor wafer 25 in accordance with FIG. 6 in enlarged detail. Connecting webs 4 composed of semiconductor material are arranged between the thinned semiconductor chips 2 in the region of their rear sides 5 since the separating grooves 6 have not completely severed the semiconductor wafer material. During the removal and thinning of the semiconductor wafer 3 from the rear side 14, this operation is stopped prematurely in order to provide an interlinked rear side 24 of the thinned semiconductor wafer 25. It is thus possible to apply a runny adhesive layer of low viscosity which does not penetrate into the separating grooves despite its low viscosity.

FIG. 8 shows a schematic cross section through the thinned semiconductor wafer 25 in accordance with FIG. 7 after the application of an adhesive layer 1 to the rear side 24 of the thinned semiconductor wafer 25. Said adhesive layer 1 is constructed from a curable adhesive 10. Consequently, in this method step, the rear sides 5 of the thinned semiconductor chips 2 are supplied with a curable adhesive 10 having a thickness w which simultaneously minimizes mechanical loadings of the thinned semiconductor chips 2 in further processing and simplifies further processing steps. Furthermore, the thinned semiconductor chips 2 are thereby prepared for being incorporated and fixed into semiconductor devices with said adhesive layer 1. Consequently, the preparation for incorporating the thinned semiconductor chips 2 into a semiconductor device already begins with the method step shown in FIG. 8.

FIG. 9 shows a schematic cross section through the thinned semiconductor wafer 25 in accordance with FIG. 8 under UV exposure 18 of the thinned semiconductor wafer 25. For this purpose, an exposure mask 23 is used which protects the rear sides 5 of the semiconductor chips 2 against exposure and cures only the adhesive layer 1 in the region of the connecting webs 4.

FIG. 10 shows a schematic cross section of the thinned semiconductor chips 2 in accordance with FIG. 9 after the curing of the adhesive layer 1 shown there on the regions of the connecting webs 4. The cured adhesive 11 in the regions of the connecting webs 4 is marked by blackening, while the curable adhesive 10 on the semiconductor chip rear sides remains unchanged and forms the adhesive layer 1.

FIG. 11 shows a schematic cross section 4 through the thinned semiconductor wafer 25 in accordance with FIG. 10 after the application of a supporting and transporting film 9 to the partly cured adhesive layer 1. The supporting and transporting film 9 is clamped into a mounting frame (not shown here) and can consequently be relatively thin. As soon as the supporting plate 17 has been removed, said film performs the stabilizing supporting function of the supporting plate 17 during interim storage and/or further processing.

FIG. 12 shows a schematic cross section through the thinned semiconductor wafer 25 in accordance with FIG. 11 after the removal of the supporting plate 17 shown there. Since the supporting and transporting film 9 is clamped into a mounting frame and is held completely level, the supporting plate 17 shown in FIG. 11 can be removed from the protective film in the method step shown in FIG. 12. The protective film protects the sensitive active top sides 8 of the thinned semiconductor chips 2 during transport and handling of the supporting and transporting film 9 in its mounting frame, which is not shown here.

Consequently, the protective film 7 applied at the start of the method in FIG. 4 during the coating of the active top side of the semiconductor wafer 3 can be used further. Below the protective film and in the mounting frame with the supporting and transporting film 9, the multiplicity of thinned semiconductor chips 2 of a semiconductor wafer can advantageously be subjected to interim storage securely and without damage to the sensitive active top sides 8 of the thinned semiconductor chips 2. After the removal of the protective film, the top sides 8 of the semiconductor chips 2 are finally completely uncovered, the separating grooves 6 extending between them, as shown in FIG. 2.

FIG. 12 furthermore shows a stylus 19 for raising or lifting off one of the thinned semiconductor chips 2 from the supporting and transporting film 9. The lift-off of the thinned semiconductor chip 2 from the supporting and transporting film 9 by means of the stylus 19 is facilitated by the non-cured adhesive layer 1 and its minimal adhesion to the surface 22 of the supporting and transporting film 9. Furthermore, this also ensures that the thinned semiconductor chip 2 does not break or is not damaged in some other form during the lift-off process. During the lift-off operation, the connecting webs 4 form desired breaking points that free the semiconductor chip. The freed thinned semiconductor chip 2 is picked up after being raised by the stylus 19 by a vacuum pipette (not shown), such as is known from the patent specification DE 101 59 974, and is transported further for further processing in an automatic singulation and placement machine and processed further.

Figure 13:
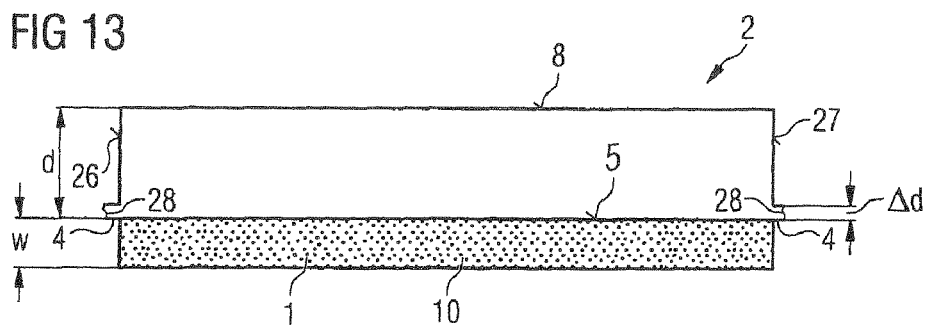
FIG. 13 shows a schematic cross section through a thinned semiconductor chip with an adhesive layer having a non-cured adhesive on the rear side of the thinned semiconductor chip.

FIG. 13 shows a schematic cross section through a thinned semiconductor chip 2 with an adhesive layer 1 having a thickness w, which has a non-cured adhesive 10 covering the rear side 5 of the thinned semiconductor chip 2. With this non-cured adhesive layer 1, the semiconductor chip 2 can be applied to a system carrier of a semiconductor device and be fixed there in a simple manner, such that the curable adhesive layer 1 introduced by the method step shown in FIG. 7 is found again at least in parts in the semiconductor device. On the edge sides 26 and 27, the semiconductor chip has fracture areas 28 in a section having the thickness Δd of a few micrometers, which stem from desired breaking points in the region of the broken connecting webs 4.

What is claimed is:

1. A method for making a semiconductor comprising:
applying an adhesive layer to a thinned rear side of a semiconductor wafer, having separating grooves cutting through it on an active top side surrounding semiconductor chips and held together by connecting webs composed of semiconductor wafer material; and
selectively irradiating the adhesive layer on the thinned rear side only in a region of the connecting webs.

2. The method of claim 1, comprising:
wherein selectively irradiating includes formation of cured adhesive on the connecting webs and with maintenance of a non-cured adhesive in the region of the rear sides of the thinned semiconductor chips.

3. The method of claim 2, comprising:
applying a supporting and transporting film to the adhesive layer, wherein the adhesion of the non-cured adhesive of the adhesive layer to the rear sides of the semiconductor chips is greater than the adhesion of the non-cured adhesive to the supporting and transporting film, while the cured adhesive is adhesively fixed on the supporting and transporting film.

4. The method of claim 1, wherein prior to the application of the adhesive layer to the thinned rear side of the semiconductor wafer, comprising:
producing a semiconductor wafer having an active top side and an opposite rear side, wherein a multiplicity of semiconductor chip positions are arranged in rows and columns on the active top side, and wherein separating tracks are provided between the semiconductor chip positions;
introducing separating grooves along the separating tracks, wherein connecting webs composed of semiconductor material remain between the semiconductor chip positions;
applying an adhesive protective film with a supporting plate to the top side with separating grooves; and
thinning by grinding of the semiconductor wafer from its rear side until a desired connecting web thickness is reached.

5. A method for making a semiconductor comprising:
applying an adhesive layer to a thinned rear side of a semiconductor wafer, having separating grooves cutting through it on an active top side surrounding semiconductor chips and held together by connecting webs composed of semiconductor wafer material;
selectively irradiating the adhesive layer on the thinned rear side in a region of the connecting webs to form cured adhesive on the connecting webs and to maintain non-cured adhesive in the region of the rear sides of the thinned semiconductor chips;
applying a supporting and transporting film to the adhesive layer, wherein the adhesion of the non-cured adhesive of the adhesive layer to the rear sides of the semiconductor chips is greater than the adhesion of the non-cured adhesive to the supporting and transporting film, while the cured adhesive is adhesively fixed on the supporting and transporting film; and
lifting-off the thinned semiconductor chips with an adhesive layer composed of non-cured curable adhesive from the supporting and transporting film with breaking up of the connecting webs composed of semiconductor wafer material along the separating grooves.

6. A method for making a semiconductor comprising:
applying an adhesive layer of an adhesive curable by using irradiation to a ground-thin rear side —linked together by connecting webs —of a semiconductor wafer, which has separating grooves cutting through it on its active top side and which is held together by the connecting webs composed of semiconductor wafer material that remained during a thinning by grinding process and by a protective film arranged on active top sides of semiconductor chips that are surrounded by the separating grooves;
selectively irradiating the adhesive layer on the thinned rear side of the semiconductor wafer in the region of the connecting webs with formation of cured adhesive on the connecting webs and with maintenance of a non-cured adhesive in the region of the rear sides of the thinned semiconductor chips;
application of a supporting and transporting film to the adhesive layer, wherein the adhesion of the non-cured adhesive of the adhesive layer to the rear sides of the semiconductor chips is greater than the adhesion of the non-cured adhesive to the supporting and transporting film, while the cured adhesive is adhesively fixed on the supporting and transporting film;
removal of the protective film from the active top sides of the semiconductor chips; and
lift-off of the thinned semiconductor chips with an adhesive layer composed of non-cured curable adhesive from the supporting and transporting film with breaking up of the connecting webs composed of semiconductor wafer material along the separating grooves.

7. The method of claim 6, wherein prior to the application of the adhesive layer to the ground-thin rear side of a semiconductor wafer, the following method steps are carried out:
production of a semiconductor wafer having an active top side and an opposite rear side, wherein a multiplicity of semiconductor chip positions are arranged in rows and columns on the active top side, and wherein separating tracks are provided between the semiconductor chip positions;

introduction of separating grooves along the separating tracks, wherein the separating grooves reach a depth (t) that is smaller than the thickness (D) of the semiconductor wafer and less than the thickness (d) of the thinned semiconductor chips, wherein connecting webs composed of semiconductor material having a thickness of $\Delta d = d - t$ remain between the semiconductor chip positions;

application of an adhesive protective film with a supporting plate to the top side with separating grooves;

thinning by grinding of the semiconductor wafer from its rear side until the connecting web thickness $\Delta d$ is reached.

8. The method of claim 6, wherein the selective irradiation is effected by using UV irradiation of a UV-curable adhesive.

9. The method of claim 6, wherein an adhesive whose adhesion to the rear sides of the semiconductor chips is higher than the adhesion of the protective film to the top sides of the semiconductor chips is used for the adhesive layer.

10. The method of claim 6, wherein the removal of the protective film from the top side is effected by pulling off.

11. The method of claim 6, wherein the removal of the protective film from the top side is effected by sputtering.

12. The method of claim 6, wherein the removal of the protective film from the top side is effected by dissolution in a solvent.

13. The method of claim 6, wherein the removal of the protective film from the top side is effected by swelling of the protective film in a solvent with subsequent pulling off.

14. The method of claim 6, wherein the removal of the protective film from the top side is effected by swelling of the protective film by means of heating with subsequent pulling off.

15. The method of claim 6, wherein the supporting and transporting film has a mounting frame and is mounted with the mounting frame after the irradiation and the curing of the adhesive of the adhesive layer in the regions of the separating grooves at an automatic singulation and placement machine.

16. The method of claim 6, wherein the lift-off of the thinned semiconductor chips with non-cured adhesive layer from the supporting and transporting film is effected by using a stylus that pierces the supporting and transporting film and transfers the thinned semiconductor chip to a vacuum pipette for further transport, the connecting webs breaking.

17. The method of claim 6, wherein the thinned semiconductor chips for further processing to form semiconductor devices with the non-cured adhesive layer on their rear sides are adhesively bonded on semiconductor chip positions of a wiring carrier.

18. The method of claim 6, wherein the selective irradiation of the adhesive layer is effected by using UV exposure through an exposure mask.

19. The method of claim 6, wherein the selective irradiation is effected by a laser writing beam that is guided along the connecting webs and cures the adhesive layer.

* * * * *